(12) United States Patent
Pousset et al.

(10) Patent No.: US 7,542,737 B2
(45) Date of Patent: Jun. 2, 2009

(54) METHOD FOR REDUCING THE 2ND ORDER INTERMODULATION LEVEL OF A TRANSCONDUCTOR, AND CORRESPONDING TRANSCONDUCTOR

(75) Inventors: Fabien Pousset, Herbeys (FR); Frédéric Rivoirard, Fontaine (FR) i

(73) Assignee: STMicroelectronics S.A., Montrouge (FR)

( * ) Notice: Subject to any disclaimer, the term of this patent is extended or adjusted under 35 U.S.C. 154(b) by 454 days.

(21) Appl. No.: 11/530,215

(22) Filed: Sep. 8, 2006

(65) Prior Publication Data

US 2007/0082631 A1    Apr. 12, 2007

(30) Foreign Application Priority Data

Sep. 13, 2005    (FR) .................................. 05 09304

(51) Int. Cl.
*H04B 1/04* (2006.01)
*H04B 1/00* (2006.01)

(52) U.S. Cl. ..................................... 455/114.2; 455/295

(58) Field of Classification Search .............. 455/114.1, 455/114.2, 295, 296, 311, 312, 63.1; 327/551; 375/296, 346; 330/291, 293, 149
See application file for complete search history.

(56) References Cited

U.S. PATENT DOCUMENTS

| 5,115,206 | A | 5/1992 | Mack et al. .................. 330/261 |
| 6,023,196 | A | 2/2000 | Ashby et al. ................. 330/290 |
| 2002/0067205 | A1* | 6/2002 | Aparin et al. ................ 330/149 |
| 2004/0043742 | A1 | 3/2004 | Beumer ...................... 455/323 |

* cited by examiner

*Primary Examiner*—Nguyen Vo
(74) *Attorney, Agent, or Firm*—Lisa K. Jorgenson; Allen, Dyer, Doppelt, Milbrath & Gilchrist, P.A.

(57) ABSTRACT

A transconducting device includes at least one transistor having a control electrode for receiving an input signal whose frequency spectrum contains two different frequencies, an output electrode for delivering an output signal, and a third electrode. The transconducting device further includes a voltage source for delivering a DC reference voltage, and a feedback controller for feedback-controlling the voltage on the third electrode to the DC reference voltage using a negative feedback loop. The negative feedback loop includes resistive damping, connects the third electrode and the control electrode, and has an open-loop gain greater than unity at a frequency equal to the frequency separation between the two different frequencies.

25 Claims, 3 Drawing Sheets

METHOD FOR REDUCING THE 2ND ORDER INTERMODULATION LEVEL OF A TRANSCONDUCTOR, AND CORRESPONDING TRANSCONDUCTOR

FIELD OF THE INVENTION

The invention relates to transconducting devices, notably radio frequency transconducting devices to be incorporated into radio frequency receivers such as cellular mobile telephones, and more particularly, to the reduction of the $2^{nd}$ order intermodulation level in such transconducting devices.

The invention can be advantageously applied to, but is not limited to, wireless communication system components, for example cellular mobile telephones operating according to the GSM standard that uses a constant envelope modulation, or operating according to the WCDMA standard that uses a variable envelope modulation.

BACKGROUND OF THE INVENTION

Transconductor devices, such as transistors, are generally non-linear devices. For this reason, an intermodulation results in the occurrence of intermodulation bands in the communications channel, causing a degradation of the signal/noise ratio, or a phase-trajectory error.

When two signals or tones having the same amplitude and different frequencies are applied to a non-linear device, such as a simple transistor biased ideally via an anti-surge inductor, two intermodulation components of order 2 (IMD2) in the output signal having frequencies respectively equal to the sum and to the difference of the frequencies of the two input signals are obtained. Moreover, the $2^{nd}$ order intermodulation component, whose frequency is equal to the frequency separation of the two tones, may be situated within the useful band of the signal and may consequently interfere with this signal.

Current radio frequency receivers use architectures of the zero intermediate frequency type (ZIF architecture), which consequently offer a direct conversion into base band, or low intermediate frequency architectures. In these types of architecture, the radio frequency input signal is directly converted into base band, or in the neighborhood of the base band (intermediate frequency signal) in a single step by way of a frequency transposition using a local oscillator signal.

This type of architecture does not require an external intermediate frequency filter, and allows a single local oscillator to be used. For these reasons, these architectures have a lower cost and are widely used. One drawback of these architectures resides in the presence of a $2^{nd}$ order intermodulation level, also called second order intermodulation distortion (IMD2) which, as indicated previously, introduces undesirable spectral components into the base band and, consequently, degrades the sensitivity of the receiver.

In radio frequency receivers, the $2^{nd}$ order intermodulation components are generated by non-linearities, unmatched components and undesirable signal leakages within the radio frequency stage. However, the main cause of the appearance of IMD2 resides in the non-linearity of the transconductors.

Furthermore, the specifications on the values of power supply voltage and on the current consumption are becoming more drastic for radio frequency receivers. Thus, the receiver needs to be capable of simultaneously supplying several blocks of stacked cells with a low power supply voltage and of reducing the current consumption.

Various approaches exist for forming a transconducting device, in particular in a radio frequency receiver. These approaches differ in the relationship between the transconducting device and the mixing device (frequency transposition device) and/or the type of architecture of the transconducting device.

As far as the connection between the transconducting and mixing devices is concerned, a first architecture includes coupling the transconducting element to the mixing device via an AC coupling, generally via a capacitive stage, thus blocking the DC component. Then only the high-frequency components of the signal migrate towards the input of the mixer. Consequently, the IMD2 components produced by the transconductor stage are eliminated, or at least greatly weakened, at the input of the mixer.

Such an architecture has a drawback in terms of power consumption. This is because two different biasing approaches are needed: one for the transconductor stage and the other for the mixer-load stack. Consequently, this results in a high current consumption.

In contrast, for an architecture in which the transconductor stage is directly connected to the input of the mixer via a coupling of the DC type, only one biasing approach is required to bias both the transconductor stage and the mixing stage. The current consumption is therefore low.

In this architecture, all the frequency components of the signal migrate towards the input of the mixer. Consequently, the IMD2 frequency components produced by the transconductor stage are unsuppressed at the input of the mixer stage.

Such an architecture also has another drawback. The problem is that the more the value of the power supply voltage is reduced, the more difficult it becomes to form a transconductor stage-mixer/load stage stack, between the power supply terminal and ground because of the voltage drops across the terminals of each of the elements of the stack.

As far as the type of architecture of the transconductor stage itself is concerned, an architecture of the pseudo-differential type and an architecture that is fully differential may essentially be distinguished. In a pseudo-differential architecture, the biasing of the stage is effected by applying two DC voltages to the bases of the transistors of the transconductor stage. Such a structure has the disadvantage of exhibiting a low emitter impedance both at low and high frequencies. Consequently, the low-frequency currents, and therefore the IMD2 currents, are high at the output of the transconductor stage.

A fully-differential transconductor structure differs from the preceding structure in the sense that the biasing of the transconductor stage is effected by a current source connected to the transistor emitters. The result of this is then that the emitter impedance of this architecture is high at low frequency. Consequently, the IMD2 currents are low at the output of the transconductor stage.

Such an architecture has the drawback of making the stacking of all the cell blocks (transconductor stage, mixer-load stage) difficult with a low power supply voltage.

SUMMARY OF THE INVENTION

An object of the invention is to provide a transconducting device that produces a very low level $2^{nd}$ order intermodulation, with a low voltage drop, while at the same time reducing the current consumption of a radio frequency receiver into which the transconducting device is incorporated.

According to one aspect of the invention, a method for reducing the $2^{nd}$ order intermodulation level of a transconductor at a desired frequency is provided. The transconductor may comprise at least one transistor having a control electrode for receiving an input signal, for example a radio frequency signal, whose frequency spectrum contains two frequencies whose separation in frequency is equal to the desired frequency, an output electrode for delivering an output signal and a third electrode.

The voltage on the third electrode may be feedback controlled to a DC reference voltage via a negative feedback loop with resistive damping. The loop may connect the third electrode to the control electrode, and have an open-loop gain greater than unity at the desired frequency.

The higher the open-loop gain at the desired frequency, the more the $2^{nd}$ order intermodulation level will be reduced at this frequency. A gain higher than 10, for example around 100, will therefore be chosen.

Furthermore, the DC reference voltage may advantageously be chosen to be low, for example lower than or equal to around 100 mV. This is because the reference voltage will determine the voltage drop across the terminals of the transconducting element, and the lower this voltage drop, the easier it becomes to stack other component blocks with the transconductor stage, for example a mixer stage and a load.

This DC reference voltage could be as low as possible. The value of the transistor bias current, which is generally fixed, and the practical considerations for forming the negative feedback damping, will be taken into account in fixing the value of the reference voltage.

Thus, a value of 100 mV, for example, was considered to be completely acceptable. The transistor is generally a bipolar transistor. The control electrode is the base of the transistor, the output electrode is the collector of the transistor, and the third electrode is the emitter of the transistor. However, the transconductor transistor can be an MOS transistor. In this case, the control electrode is the gate of the transistor, the output electrode is the drain of the transistor, and the third electrode the source of the transistor.

According to another aspect of the invention, a transconducting device comprises at least one transistor having a control electrode for receiving an input signal whose frequency spectrum contains two different frequencies, an output electrode for delivering an output signal and a third electrode.

The transconducting device may also comprise a voltage source capable of delivering a DC reference voltage and a feedback control means or controller capable of feedback-controlling the voltage on the third electrode at the DC reference voltage. These feedback control means may comprise a negative feedback loop with resistive damping connecting the third electrode and the control electrode and having an open-loop gain greater than 1 at a frequency equal to the frequency separation between the two different frequencies.

According to one embodiment, the negative feedback loop may comprise a comparator, for example formed by an operational amplifier, having a first input connected to the third electrode, a second input connected to the source of reference voltage, and an output connected to the control electrode. The resistive damping may comprise a resistor connected between a ground terminal and the first input of the comparator.

The open-loop gain is advantageously higher than 10, and the level of the reference voltage is advantageously less than or equal to around 100 mV.

According to one embodiment in which the transconductor has a differential structure with two transistors having their control electrodes connected and their third electrodes connected, the negative feedback loop connects the third electrodes to the control electrodes of the two transistors.

According to another aspect of the invention, a receiver, for example a radio frequency receiver such as a cellular mobile telephone, comprises a stack connected between a power supply terminal and a ground terminal, and includes a transconducting device such as defined above, a frequency transposition device and a load. The frequency transposition device may be directly connected via a DC coupling to the output of the transconducting device, and the load may be connected between the power supply terminal and the output of the frequency transposition device.

Thus, the invention allows, at the same time, a low voltage drop to be obtained due to the low value of the DC reference voltage, which allows a stack that may be powered by a supply voltage source of low value to be readily obtained, together with a low level of IMD2 produced by the transconductor stage, while at the same time reducing the current consumption.

BRIEF DESCRIPTION OF THE DRAWINGS

Other advantages and features of the invention will become apparent upon examining the detailed description of nonlimiting embodiments and of the appended drawings in which.

DETAILED DESCRIPTION OF THE PREFERRED EMBODIMENTS

Figure 1:
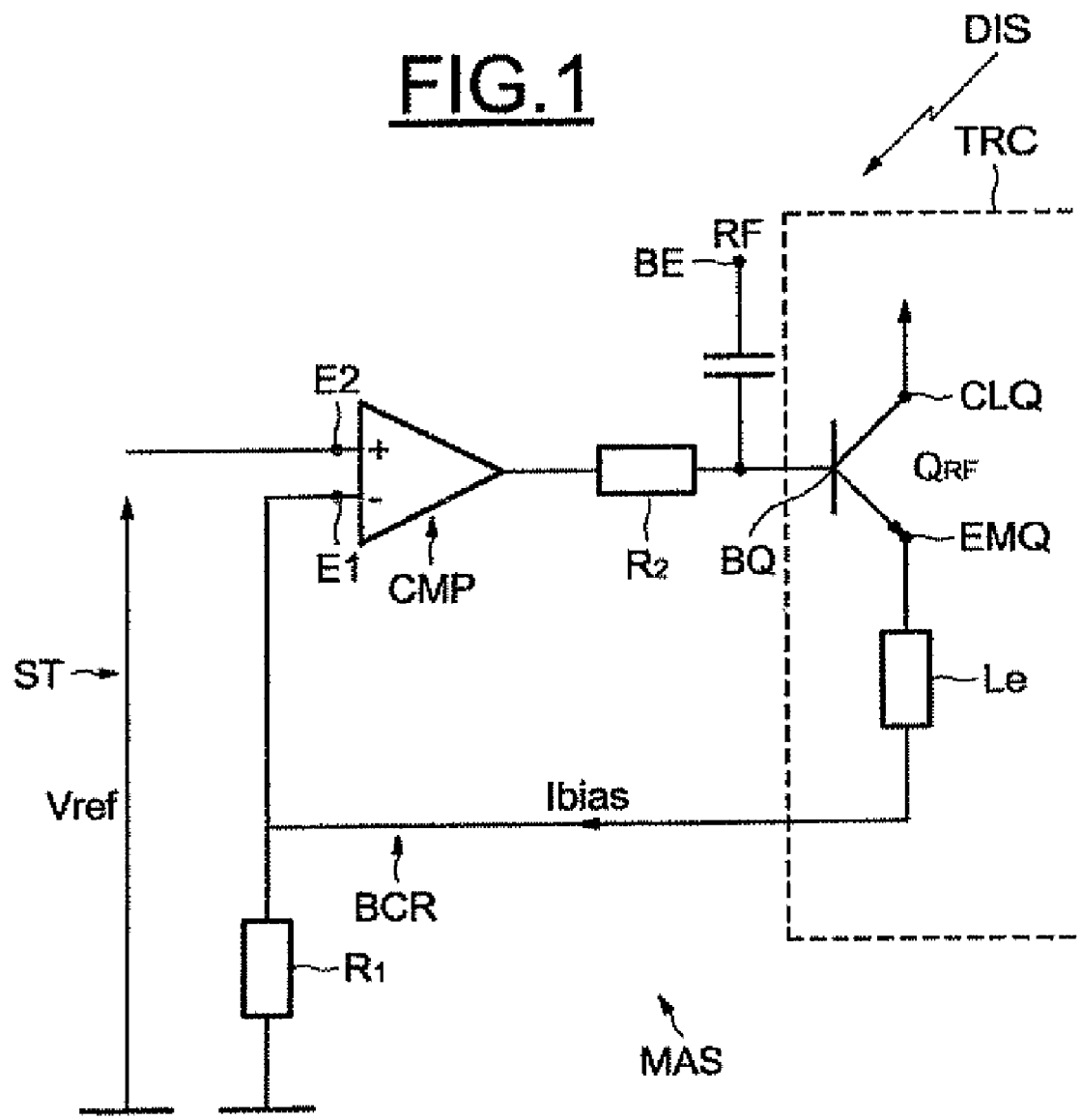
FIG. 1 illustrates schematically one embodiment of a device according to the invention.

In FIG. 1, the reference DIS denotes a transconducting device comprising a transconductor stage TRC formed by a bipolar transistor $Q^{RF}$ whose base BQ is connected to the input terminal BE of the device, via a capacitive link. In this example, the transconducting device is a radio frequency transconducting device and the input terminal BE is able to receive a radio frequency input signal RF. The output terminal of the transconducting device is formed by the collector CLQ of the transistor $Q_{RF}$.

In the case of application to a radio frequency receiver such as a cellular mobile telephone, the collector CLQ of the transistor is connected to one input of a frequency transposition stage (mixer).

The emitter EMQ of the transistor $Q_{RF}$ is connected to the base BQ via a negative feedback loop BCR comprising, in this example, a damping inductor Le, a comparator CMP and a resistor R2 connected to the output of the comparator. The negative feedback loop BCR forms part of the feedback control means or controller MAS which also comprises a resistive damping. In other words, a resistor R1 is connected between the first input E1 of the comparator and ground.

The device DIS also comprises a voltage source ST delivering a DC reference voltage Vref at the second input E2 of the comparator CMP (input +). This voltage Vref is advantageously chosen to be low. In fact, theoretically, it could be as low as possible. However, the reference voltage is defined by the product of the resistance R1 and the emitter current Ibias. Furthermore, generally speaking, this current Ibias is defined by the RF performance (gain, NF, linearity) of the transconductor $Q_{RF}$. Furthermore, the lower the voltage Vref, the lower the value of the resistor R1 would need to be, which may pose fabrication problems, particularly in terms of precision.

Those skilled in the art will therefore adjust the value of the voltage Vref on a case by case basis depending on the application. Nevertheless, a value of 100 mV is an acceptable value.

In operation, the emitter voltage is feedback controlled to the voltage Vref as follows. If the emitter voltage becomes too low, then the voltage across the terminals of the resistor R1, in other words the voltage at the input E1 of the comparator, falls below the voltage Vref. The result of this is that the operational amplifier forming the comparator CMP acts on the base of the transistor so as to increase the collector current. The emitter current also rises similarly, to within the current gain β, which has the effect of increasing the emitter voltage.

In an analogous manner, if the emitter voltage becomes too high, then the collector current will decrease as will the emitter current, and consequently the emitter voltage.

Since the emitter voltage is locked to the reference voltage by the negative feedback loop, any voltage variation on the emitter, caused by the $2^{nd}$ order intermodulation, will be cancelled out by the negative feedback loop. This effect will be all the more pronounced the higher the open-loop gain of the negative feedback loop is at a frequency corresponding to the frequency difference of the two tones causing this $2^{nd}$ order intermodulation.

In theory, it therefore suffices that this open-loop gain be greater than 1 at the frequency corresponding to the frequency difference. A gain higher than 10 and, for example, equal to 100, in a range of frequencies encompassing the frequency difference, will be chosen.

Consequently, the IMD2 current at the output of the transconductor, in other words on the collector of the transistor, will be very small. On the other hand, the open-loop gain of the loop will fall very quickly at high frequencies, and therefore, the useful frequency components of the radio frequency signal will be able to pass from the input towards the output of the transconductor.

It should be noted here that the damping inductor Le is not involved in the reduction of the $2^{nd}$ order intermodulation level. Consequently, it may be eliminated. However, it is useful in a radio frequency application for obtaining a desired radio frequency gain.

Furthermore, the value of the voltage Vref does not have any bearing either on the process for minimizing the $2^{nd}$ order intermodulation current. Nevertheless, the feedback control means together with the low value of the reference voltage allow both a significant reduction in the $2^{nd}$ order intermodulation level produced at the transconductor output and a low voltage drop, for example 100 mV across the terminals of the transconductor, to be obtained. This facilitates the stacking of different stages, even with a low power supply voltage of, for example, 2.5 V.

Figure 2:
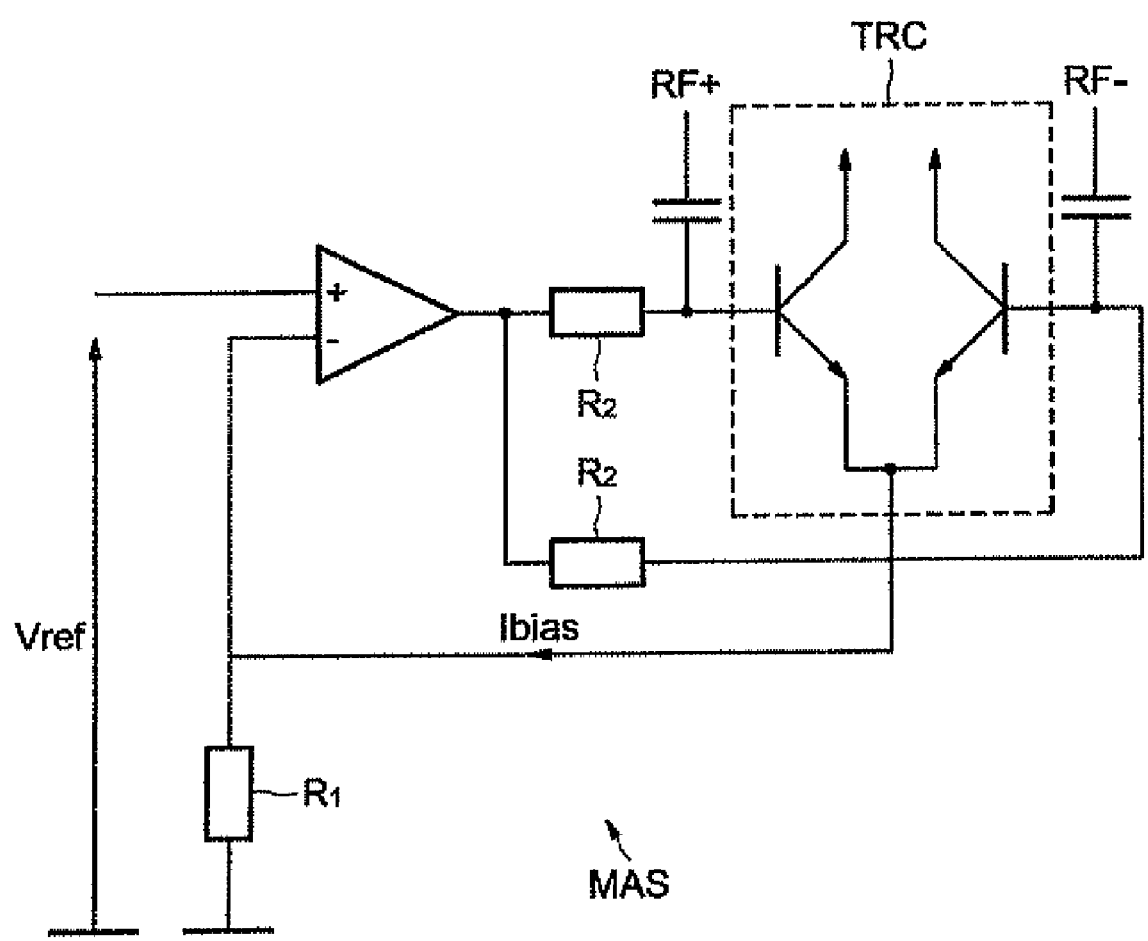
FIG. 2 illustrates schematically an embodiment with a differential structure of a device according to the invention.

The invention is, of course, also compatible with a differential transconductor structure, such as that illustrated by way of example in FIG. 2. More precisely, the transconducting device TRC in FIG. 2 comprises two bipolar transistors whose bases are connected together via the resistors R2 and whose emitters are connected together. The input signal is a differential input signal RF+ and REF− and is applied to the respective bases of the two transistors. The differential outputs of the transconducting device are formed by the two collectors of the transistors.

Moreover, the feedback control means MAS are identical to those described in FIG. 1. More precisely, the negative feedback loop connects the two emitters of the two transistors to the two bases of the latter via the comparator.

The IMD2 performance of a transconductor is generally defined by its $2^{nd}$ order intercept point (IP2) at its input (IIP2) or at its output (OIP2). More precisely, IIP2 is given by the following formula (1) and OP2 is given by the following formula (2):

$$IIP2 = Vin_{f1} + Vin_{f2} - IMD2 + G \quad (1)$$

$$OIP2 = IIP2 + G \quad (2)$$

In these formulas, IIP2 is expressed in dBV (20 $\log_{10}$ of the voltage expressed in volts).

OIP2 is expressed in dBA (20 $\log_{10}$ of the current expressed in amps).

$Vin_{f1}$ denotes the input level of the test signal at the frequency f1 expressed in dBV, and $Vin_{f2}$ denotes the input level of the signal at the frequency f2 expressed in dBV.

IMD2 denotes the absolute level of the interference signal at the frequency |f1−f2| expressed in dBA and G denotes the current/voltage gain of the transconducting element expressed as dBA-dBV.

The IMD2 performance has been characterized on different transconductor structures, using existing transconductors composed of bipolar transistors of the same size and having the same biasing current, by applying a test using two tones with f1=2 GHz+3 MHz and f2=2 GHz+3.3 MHz, and with an RF input level chosen such that the transconducting elements operate in linear mode.

TABLE 1 below shows the results obtained for an exemplary structure according to the invention, a structure of the prior art of the pseudo-differential type and a structure of the prior art of the fully-differential type.

TABLE 1

|  | Pseudo-differential structure | Fully-differential structure | Structure according to the invention |
| --- | --- | --- | --- |
| IMD2 (nA) | 4467 | 17.8 | 25.1 |
| IMD2 (dBA) | −107 | −155 | −152 |
| OIP2 (dBA) | −33 | +15 | +12 |
| Voltage drop (mV) | 0 | 400 | 100 |

It can therefore be seen that, relative to a fully-differential structure that optimizes the suppression of the level of IMD2, the structure according to the invention offers a comparable reduction. In contrast, the structure according to the invention is significantly better performing in terms of an IMD2 level relative to a structure of the pseudo-differential type.

As far as the voltage drop is concerned, it can be seen that the structure according to the invention, whose voltage drop is in fact equal to the value of the reference voltage Vref, exhibits a voltage drop which, although higher than the optimum provided by the pseudo-differential structure, is much lower than that of a fully-differential structure.

Figure 3:
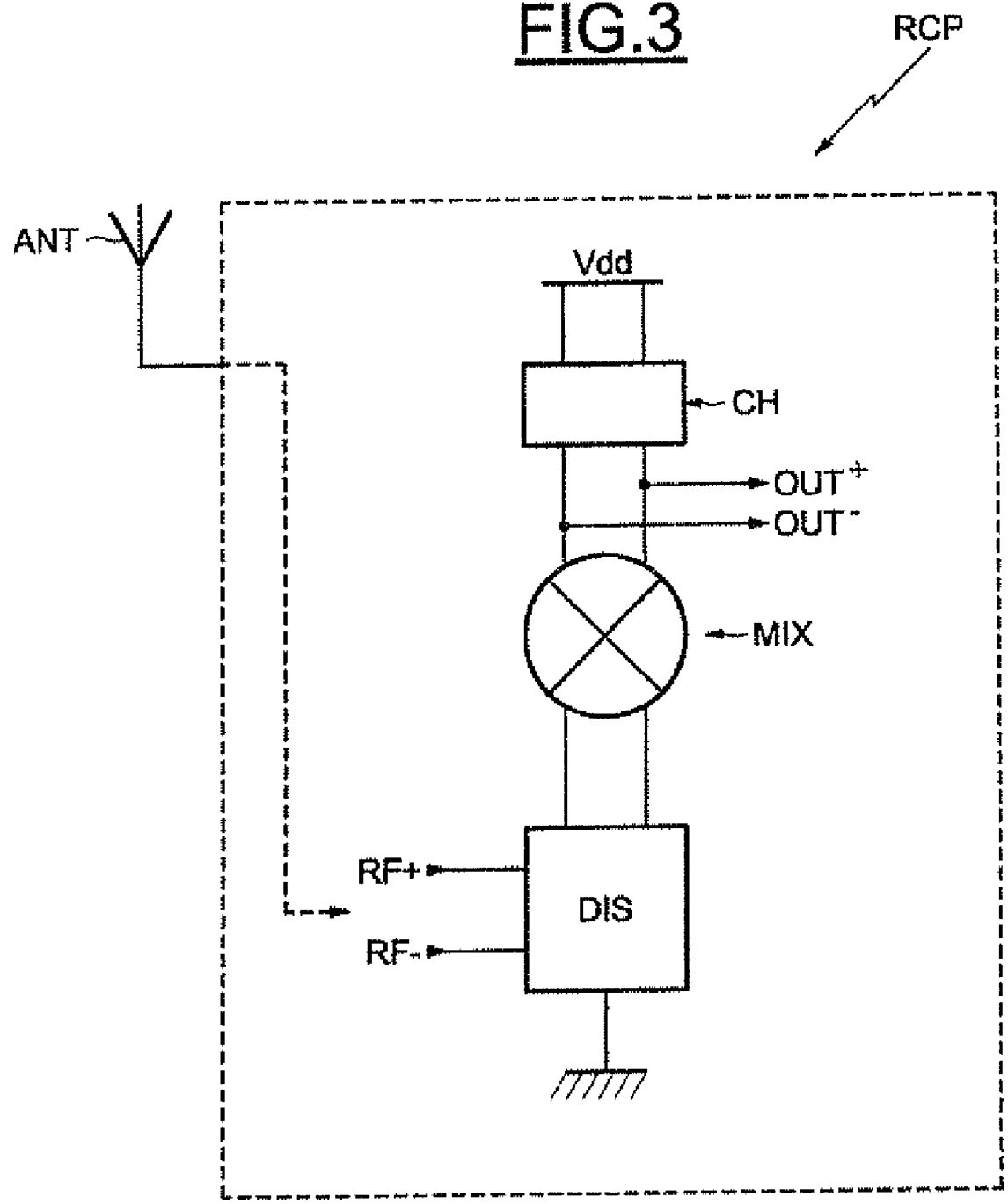
FIG. 3 illustrates schematically one embodiment of a receiver incorporating a transconducting device according to the invention.

Moreover, the fact that the voltage drop is low with a structure according to the invention readily allows, as is illustrated in FIG. 3, a stack comprising the transconductor stage DIS, a frequency transposition stage MIX and a load stage CH to be formed between the power supply voltage VDD and ground. Such a stack may be part of the analog radio frequency stage connected to the antenna ANT of a cellular mobile telephone RCP.

Indeed, if the power supply voltage VDD is around 2.5 V for example, only having 100 mV across the terminals of the device DIS does not pose a problem for the supply and biasing of the upper stages. In addition, the drawback of such a DC coupling that resides in the delivery, at the input of the mixer stage, of the levels of IMD2 produced at the output of the device DIS, is here greatly diminished due to the fact that these IMD2 levels are, according to the invention, reduced to a very low level.

That which is claimed:

1. A method for reducing a $2^{nd}$ order intermodulation level of a transconductor at a desired frequency, the transconductor comprising at least one transistor comprising a control electrode, an output electrode and a third electrode, the method comprising:

providing an input signal to the control electrode whose frequency spectrum contains two frequencies whose separation in frequency is equal to the desired frequency;

controlling a voltage on the third electrode to a reference voltage via a negative feedback loop with resistive damping, the negative feedback loop connecting the third electrode to the control electrode and having an open-loop gain greater than unity at the desired frequency; and providing an output signal at the output electrode.

2. A method according to claim 1, wherein the open-loop gain is greater than 10.

3. A method according to claim 1, wherein the reference voltage comprises a DC voltage less than or equal to about 100 mV.

4. A method according to claim 1, wherein the at least one transistor comprises a bipolar transistor comprising a base, a collector and an emitter; and wherein the control electrode corresponds to the base, the output electrode corresponds to the collector, and the third electrode corresponds to the emitter.

5. A transconducting device comprising:

at least one transistor comprising a control electrode for receiving an input signal whose frequency spectrum contains two different frequencies, an output electrode for delivering an output signal, and a third electrode; and a feedback controller for feedback-controlling a voltage on the third electrode based upon a reference voltage, and comprising a negative feedback loop with resistive damping coupling the third electrode and the control electrode, and having an open-loop gain greater than unity at a frequency equal to a frequency separation between the two different frequencies.

6. A transconducting device according to claim 5, wherein said negative feedback loop comprises a comparator having a first input connected to the third electrode, a second input connected to the voltage source, an output connected to the control electrode; and wherein the resistive damping comprises a resistor connected between ground and the first input of said comparator.

7. A transconducting device according to claim 5, wherein the open-loop gain is greater than 10.

8. A transconducting device according to claim 5, wherein the reference voltage comprises a DC voltage less than or equal to about 100 mV.

9. A transconducting device according to claim 5, wherein said at least one transistor comprises a base, a collector and an emitter; and wherein the control electrode corresponds to the base, the output electrode corresponds to the collector, and the third electrode corresponds to the emitter.

10. A transconducting device according to claim 5, wherein said at least one transistor comprises a pair of transistors forming a differential structure, said pair of transistors having their control electrodes connected together and their third electrodes connected together; and wherein said negative feedback loop connects the third electrodes to the control electrodes of said pair of transistors.

11. A receiver comprising:

a transconducting device comprising at least one transistor comprising a control electrode for receiving an input signal whose frequency spectrum contains two different frequencies, an output electrode for delivering an output signal, and a third electrode, and a feedback controller for feedback-controlling a voltage on the third electrode based upon a reference voltage, and comprising a negative feedback loop with resistive damping coupling the third electrode and the control electrode, and having an open-loop gain greater than unity at a frequency equal to a frequency separation between the two different frequencies;

a mixer coupled to the output electrode of said transconducting device; and a load coupled between a power supply terminal and an output of said mixer.

12. A receiver according to claim 11, wherein the open-loop gain is higher than 10.

13. A receiver according to claim 11, wherein the reference voltage comprises a DC voltage less than or equal to about 100 mV.

14. A receiver according to claim 11, wherein said transistor comprises a bipolar transistor, the control electrode corresponding to a base of said bipolar transistor, the output electrode corresponding to a collector of said bipolar transistor, and a third electrode corresponding to an emitter of said bipolar transistor.

15. A receiver according to claim 11, wherein said at least one transistor comprises a pair of transistors forming a differential structure, said pair of transistors having their control electrodes connected and their third electrodes connected; and wherein said negative feedback loop (BCR) connects the third electrodes to the control electrodes of said pair of transistors.

16. A receiver according to claim 11, wherein said transconducting device, said mixer and said load is configured to operate in a cellular mobile telephone.

17. A receiver according to claim 11, wherein the voltage reference comprises ground.

18. A receiver according to claim 11, wherein said mixer is coupled to the output electrode via a DC coupling.

19. A cellular mobile telephone comprising:

an antenna; and a receiver coupled to said antenna and comprising a transconducting device comprising at least one transistor comprising a control electrode for receiving an input signal whose frequency spectrum contains two different frequencies, an output electrode for delivering an output signal, and a third electrode, and a feedback controller for feedback-controlling a voltage on the third electrode based upon a reference voltage, and comprising a negative feedback loop with resistive damping coupling the third electrode and the control electrode, and having an open-loop gain greater than unity at a frequency equal to a frequency separation between the two different frequencies;

a mixer coupled to the output electrode of said transconducting device; and a load coupled between a power supply terminal and an output of said mixer.

20. A cellular mobile telephone according to claim 19, wherein the open-loop gain is higher than 10.

21. A cellular mobile telephone according to claim 19, wherein the reference voltage comprises a DC voltage less than or equal to about 100 mV.

22. A cellular mobile telephone according to claim 19, wherein said transistor comprises a bipolar transistor, the control electrode corresponding to a base of said bipolar transistor, the output electrode corresponding to a collector of said bipolar transistor, and a third electrode corresponding to an emitter of said bipolar transistor.

23. A cellular mobile telephone according to claim 19, wherein said at least one transistor comprises a pair of transistors forming a differential structure, said pair of transistors having their control electrodes connected and their third electrodes connected; and wherein said negative feedback loop connects the third electrodes to the control electrodes of said pair of transistors.

24. A cellular mobile telephone according to claim 19, wherein the voltage reference comprises ground.

25. A cellular mobile telephone according to claim 19, wherein said mixer is coupled to the output electrode via a DC coupling.

* * * * *

UNITED STATES PATENT AND TRADEMARK OFFICE
CERTIFICATE OF CORRECTION

PATENT NO. : 7,542,737 B2  
APPLICATION NO. : 11/530215  
DATED : June 2, 2009  
INVENTOR(S) : Pousset et al.

Page 1 of 1

It is certified that error appears in the above-identified patent and that said Letters Patent is hereby corrected as shown below:

| | |
|---|---|
| On the Title Page, Item [75] | Delete: "(FR) i" <br> Insert: -- (FR) -- |
| On the Title Page, Item [73] | Delete: "S.A." <br> Insert: -- SA -- |
| Column 4, Line 33 | Delete: "$Q^{RF}$" <br> Insert: -- $Q_{RF}$ -- |
| Column 5, Line 57 | Delete: "REF-" <br> Insert: -- RF- -- |
| Column 6, Line 1 | Delete: "OP2" <br> Insert: -- OIP2-- |

Signed and Sealed this

First Day of September, 2009

David J. Kappos  
*Director of the United States Patent and Trademark Office*